United States Patent [19]
Mulder et al.

[11] 4,009,397
[45] Feb. 22, 1977

[54] LOGIC CIRCUIT

[75] Inventors: Cornelis Mulder, Beekbergen; Henricus Elisabeth Jozef Wulms, both of Eindhoven, Netherlands

[73] Assignee: U.S. Philips Corporation, New York, N.Y.

[22] Filed: Aug. 6, 1975

[21] Appl. No.: 602,472

[30] Foreign Application Priority Data
Nov. 1, 1974 Netherlands ............... 7414273

[52] U.S. Cl. .................... 307/203; 307/213; 307/214; 307/303; 357/15; 357/44; 357/46
[51] Int. Cl.² ........................... H03K 19/08
[58] Field of Search ......... 307/203, 213, 214, 215, 307/296, 303; 357/15, 44, 46

[56] References Cited
UNITED STATES PATENTS
3,509,364  4/1970  Buckley ............... 307/203
3,816,758  6/1974  Berger et al. ........ 307/214

*Primary Examiner*—John Zazworsky
*Attorney, Agent, or Firm*—Frank R. Trifari; Jack Oisher

[57] ABSTRACT

A logic circuit in I²L wherein across the base-emitter paths of the NPN-transistors diodes are connected in order to reduce the propagation delay time of the logic circuit.

6 Claims, 6 Drawing Figures

LOGIC CIRCUIT

The invention relates to Integrated Injection Logic (I²L) circuits.

I²L comprises a logic gate circuit, which comprises a first group of transistors whose base-emitter paths or collector-emitter paths are connected in parallel, while parallel to the collector-emitter path of at least one of the transistors of the first group the base-emitter paths of a number of transistors of a second subsequent group are included. The base of the transistors of both the first and the second group are connected to a current source coupled to the common connection point of the emitters of the transistors of the relevant group.

Large-scale integration is possible with such gate circuits, which can be integrated very simply and compactly and which have a low dissipation per gate circuit without excessively impairing its speed. The known I²L circuits consists of transistors which are powered through injection of minority charge carriers. Injection is effected either by radiation exposure of base-emitter regions, or from an injection rail which with the emitter regions forms a PN-junction. The switching speed of the circuit can be varied within wide limits by selection of the current level.

A logic gate circuit of this type is, for example, known from the "Philips Technisch Tijdschrift" 33, N. 3, 1973, page 84, FIG. 6. The first group consists of two transistors whose collector-emitter paths are connected in parallel, the logic input signals being applied to the base electrodes of said transistors. The second group consists of two transistors whose base-emitter paths are connected in parallel. Furthermore, the known logic gate circuit comprises a third group of two transistors whose base-emitter paths are connected in parallel. The collector of one of the transistors of the third group is interconnected to the collector of a transistor of the second group. The transistors in the circuit provide the logic inversion of the base signal, while the connection of the collectors provides a "wired-and" function of the collector signals. As a result, the transistors with interconnected collectors may also be regarded as NOR-gates. As is evident from FIG. 6 of the cited article, such circuits may also take the form of multi-collector transistors and inter alia in view of the requirement to supply each collector with only one base, the transistors of the known circuit may be combined, see FIG. 7 on page 85 of said article.

When considering the switching speeds of I²L, a distinction must be made between situations with a low and with a high current level. In the first situation only stray wiring capacitances and depletion capacitances must be charged and discharged; in the second situation the charge storage in the transistors plays a more important role. In the case of I²L, as is known, each collector must be capable of taking up or sinking one base current. As a result of this, the effective current gain factor $\beta$ of the transistor must be greater than 1. In this respect it is to be noted that the effective current gain factor in I²L technology is to be understood to mean the $\beta$ of the inverting NPN-transistor during the operating condition of said transistor in the presence of the complementary biasing PNP-transistor. This factor $\beta$ can for example be measured as the ratio between the collector and the base current of the NPN-transistor when the emitter-base junction of the PNP-transistor is short-circuited, so that the emitter of the last-mentioned transistor is connected to the emitter of the NPN-transistor. However, a high $\beta$ means that the transistor in the "ON" state will be strongly bottomed (saturated), so that minority charge carriers are stored in the transistor. This means that the charge storage in the transistor will be decisive of the switching speed of this transistor. A low $\beta$ per transistor would be desirable. However, too low a $\beta$ in its turn is objectionable for reasons of susceptibility to interference or noise. Moreover, from the point of view of yield it is difficult to control a manufacturing process in such a way that transistors with for example a $\beta=2$ can be realized. In addition, the factor $\beta$ is geometry dependent, so that a desired value of $\beta=2$ is tied to a specific geometry. A multi-collector transistor with for example two collectors almost automatically has a different current gain factor per collector than a multi-collector transistor with for example four collectors. It is far easier to realize a manufacturing process in which the current gain factors of the integrated transistors lie in the interval, say, $20<\beta<100$. However, as previously stated, this adversely affects the switching speeds of the integrated transistors.

It is an object of the invention to solve the problems outlined above and the invention is characterized in that between the base and the emitter of each of the transistors of the two groups a connection path is provided for taking up or sinking a part of the current which is supplied by the current source which is connected to the base of the relevant transistor, when the relevant transistor is in the conductive state.

In a preferred embodiment, the connection path is constituted by a diode whose forward direction is the same as the forward direction of the base-emitter junction of the relevant transistor.

Furthermore, the diode is preferably constituted by a transistor whose base and collector are interconnected, the effective emitter area of said transistor being smaller than the effective emitter area of the relevant transistor.

The invention will be described with reference to the drawing.

Figure 1:
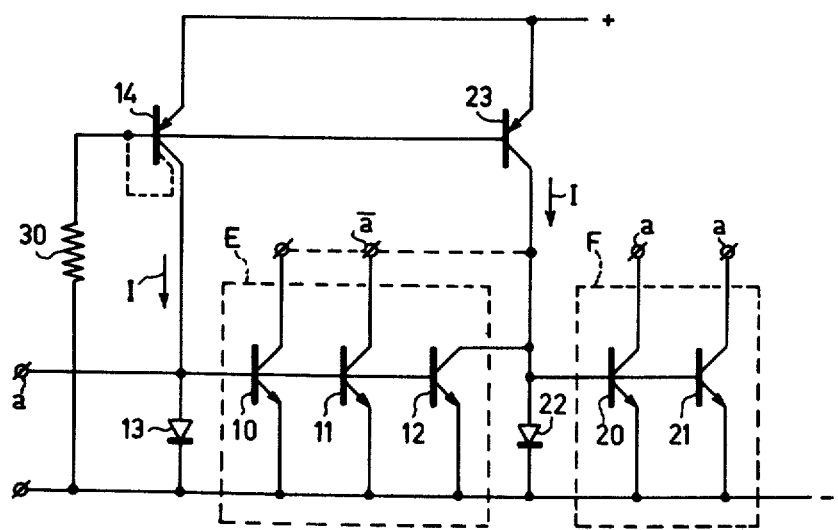
FIG. 1 shows an embodiment of a logic gate circuit according to the invention.

The logic gate circuit of FIG. 1 comprises a first group E of transistors 10, 11 and 12, whose base-emitter paths are connected in parallel. In parallel with the collector-emitter path of transistor 12 the base-emitter paths of the transistors 20 and 21 of a second group F are included. The bases of the transistors 10, 11 and 12 of the first group E are connected to a supply point of positive polarity via the collector-emitter path of a complementary biasing transistor 14. A corresponding biasing transistor 23 is provided for the second group F. Parallel to the base-emitter paths of the transistors 10, 11 and 12 of the first group E, a diode 13 is included. A corresponding diode 22 is provided for the second group F. The forward direction of the diode 13 is the same as the forward direction of the base-emitter junctions of the transistors 10, 11 and 12. The bases of the transistors 14 and 23 are connected to the connection point of the emitters of the transistors 10, 11, 12, 20 and 21 via an impedance 30. In this respect it is to be noted that in the known I²L circuits this impedance is not provided, but that the base of the transistor 14 is connected directly to the emitter for transistor 10. The impedance serves to increase the switching speed, as is described in the simultaneously filed Patent Application, Ser. No. 602,473 and the contents of which is hereby incorporated by reference. The impedance 30 is preferably formed by a resistance which is preferably dimensioned so that at the current level required for the I²L circuit a potential difference of at least 30 mV or preferably more than 60 mV is obtained across said resistance. Instead of the resistance any other suitable impedance element may be employed by means of which the required potential difference can be obtained. For example, a Schottky diode may suitably be employed for said purpose. Alternatively, an external voltage may for example be applied between the bases of the transistors of the complementary transistors. The operation of the circuit is as follows.

To simplify the explanation of the operation of the logic circuit of FIG. 1 it is assumed that the collectors of the transistors 10 and 11 are connected to the collector of the transistor 12, which in FIG. 1 is indicated by the dash line. In fact, the transistors 10, 11 and 12 then constitute one transistor, to be denoted by transistor 10 (11, 12) hereinafter. The currents supplied by the transistors 14 and 23 are assumed to equal I amperes. When a logic signal a is applied to the base of the transistor 10 (11, 12), the logic signal $\bar{a}$ (negation of a) will appear at the collector of the transistor 10 (11, 12), while at the collectors of the transistors 20 and 21 the logic signal a will be present. Assuming that $a = 1$, adhering to positive logic, which means that the condition $a = 1$ corresponds to a high voltage, the transistor 10 (11, 12) will conduct. As a result, the diode 22 and the transistors 20 and 21 will not conduct. In the absence of the diode 13 the base current of the transistor 10 (11, 12) will equal I amperes. Owing to the presence of the diode 13 a part of the current I, which is supplied by the transistor 14, will flow through said diode. The base current of the transistor 10 (11, 12) will now only be a part pxI (p < 1) of the current I.

Figure 2:
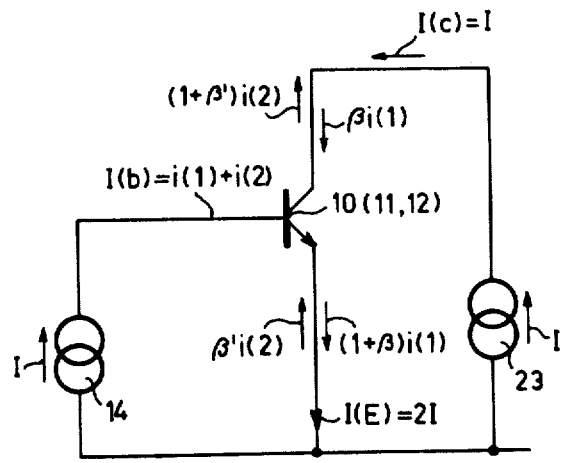
FIG. 2 shows a current diagram to explain the operation of the circuit of FIG. 1 in the absence of the diode 13.

FIG. 2 shows a current diagram to explain the operation of the circuit of FIG. 1. In said figure the current source 14 corresponds to the PNP transistor 14 of FIG. 1, the current source 23 to the PNP transistor 23 and the transistor 10 (11, 12) to the composite transistor 10 (11, 12) of FIG. 1.

The collector current of the transistor 10 (11, 12) in the absence of the diode 13 will equal the base current, so that the NPN transistor 10 (11, 12) will be bottomed. The total base current of the transistor 10 (11, 12) can be divided into two currents i(1) and i(2), as is shown in FIG. 2. These two base currents result in two internal currents $\beta x i(1)$ and $(1+\beta) x i(1)$, owing to the forward biassed emitter-base diode of the transistor 10 (11, 12) and two internal currents $\beta' x i(2)$ and $(1+\beta') x i(2)$, owing to the forward-biassed collector-base diode of the transistor 10 (11, 12). In both formulas $\beta$ is the forward current gain factor of the transistor 10 (11, 12), which is equal to the effective $\beta$, and $\beta'$ is the current gain factor of the transistor 10 (11, 12) when said transistor is operated in the inverse direction. The emitter-base voltage and the collector-base voltage of the transistor 10 (11, 12) are such that for the external currents the following equations are valid:

$$I(b) = I = i(1) + i(2) \quad (1)$$

$$I(e) = 2I = (1+\beta)i(1) - \beta'xi(2) \quad (2)$$

$$I(c) = I = \beta xi(1) - (1+\beta')i(2) \quad (3)$$

where I(b) is the external base current, I(e) the external emitter current and i(c) the external collector current of the transistor 10 (11, 12). When selecting, for example, $\beta = \beta' = 100$, then $i(1) = 0.507I$ and $i(2) = 0.493I$. The internally existing collector currents are a measure of the charge storage in the transistor. Said currents are 50.7I and 49.3I in this case. This indicates that the charge which is stored in the base is comparatively great. This means that the switching speed of the transistor will be correspondingly low.

Figure 3:
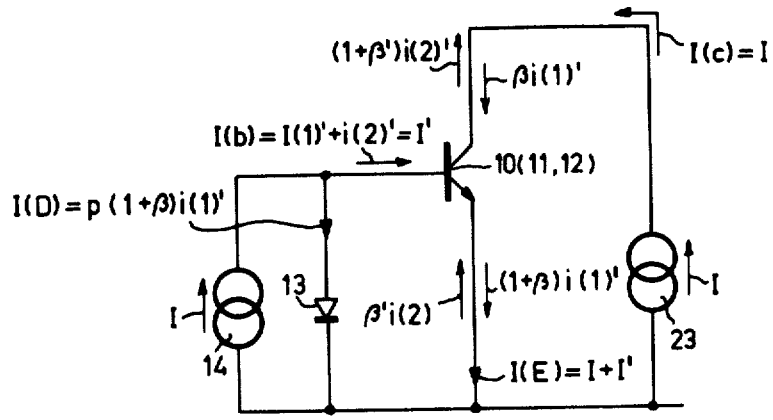
FIG. 3 shows a current diagram to explain the operation of the circuit of FIG. 1 with the diode 13 being present.

FIG. 3 shows the situation in which the diode 13 is included between the base and emitter of the transistor 10 (11, 12). Most of the current I will now flow through the diode 13. The following relations are now valid:

$$I(b) = I' = i(1)' + i(2)' \quad (4)$$

$$I(e) = I + I' = (1+\beta)i(1)' - \beta'i(2)' \quad (5)$$

$$I(c) = I = \beta i(1)' - (1+\beta')i(2)' \quad (6)$$

$$I(d) = px(1+\beta)i(1)' \quad (7)$$

$$I(d) + I(b) = I \quad (8)$$

The factor p depends on the ratio of the diode area and the effective emitter area of the NPN transistor 10 (11, 12). In this respect it is to be noted that in the case of inverse operation of a transistor, as is usual with I²L, the effective emitter zone equals the surface area of the collector zone of the transistor. For example, if said factor p is chosen to be 1/3 and when $\beta = \beta' = 100$, a simple calculation reveals that $i(1)' = 0.02I$ and $i(2)' = 0.01I$. As the current $i(1)' << i(1)$ and the current $i(2)' << i(2)$, the internal currents which flow through the transistor 10 (11, 12) are substantially smaller in this case. In the present instance the oppositely directed collector currents equal 2I and 1I respectively. This means that in this case the charge which is stored in the transistor will also be substantially smaller than in the situation without the diode. Thus the switching speed will increase accordingly.

Figure 4:
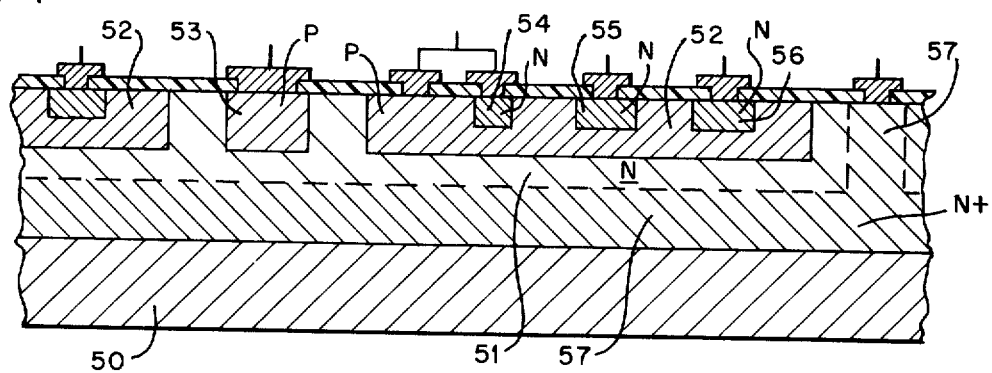
FIGS. 4, 5 and 6 show variations of the invention.

As has been demonstrated hereinbefore the inclusion of the diode 13 increases the switching speed of the logic circuit of FIG. 1. The switching speed can be additionally increased by the inclusion of the resistance 30 between the base of the transistor 14 and the emitter of the transistor 10. When the transistor 10 (11, 12) is conductive, the collector-base diode of the transistor 14 will be biassed less in the forward direction when the resistance 30 is included than in the absence of said resistance 30. If the voltage across the resistance is approximately 200 to 300 mV, the storage of minority charge carriers in the base of the transistor 14 will be negligible in comparison with the storage in the base of the transistor 10 (11, 12). In the "off"-state of the transistor 10 (11, 12) the collector-base diode of the transistor 14 has a reverse bias of 200 to 300 mV. Consequently, the switching time of the logic circuit is then only determined by the charge storage in the base of the transistor 10 (11, 12). The embodiment of FIG. 1 may, for example, be integrated in a manner as described in said concurrently filed Patent Application, Ser. No. 602,473. For instance, the NPN transistor can be of the multi-collector type, with an additional collector short-circuited to the base. This results in an emitter-base diode connected in parallel with the emitter-base junction of the NPN transistor. By making the additional collector smaller than the other collectors, the desired ratio p can be obtained. In the I²L integrated version, the complementary biasing transistor is a lateral transistor. This variation is illustrated in FIG. 4, which is a cross-section of an I²L circuit integrated in a silicon chip, similar to that illustrated in FIG. 1 of Application Ser. No. 602,473. In the chip, a P substrate 50 has an N layer 51 containing P regions 52, 53. P region 52 also includes three N regions 54, 55, 56. The N layer includes an N+ region 57 for isolation purposes. The lateral PNP transistor is formed by P region 53, N region 51 and P region 52. The multi-collector NPN. transistor is formed by common N region 51, common P region 52 and separate N collectors 54-56. As will be noted, collector 54 has a smaller collecting area then collectors 55 and 56 and is shorted to base region 52. This produces an emitter-base diode with an effective emitter area smaller than that of NPN transistor 55-52-55 and connected in parallel with its emitter 51-base 52 junction.

Figure 5:
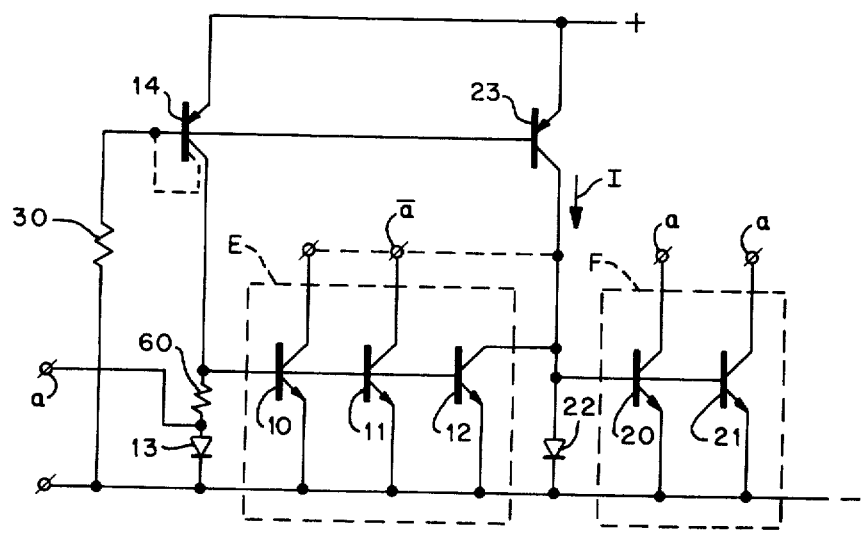
Figure 6:
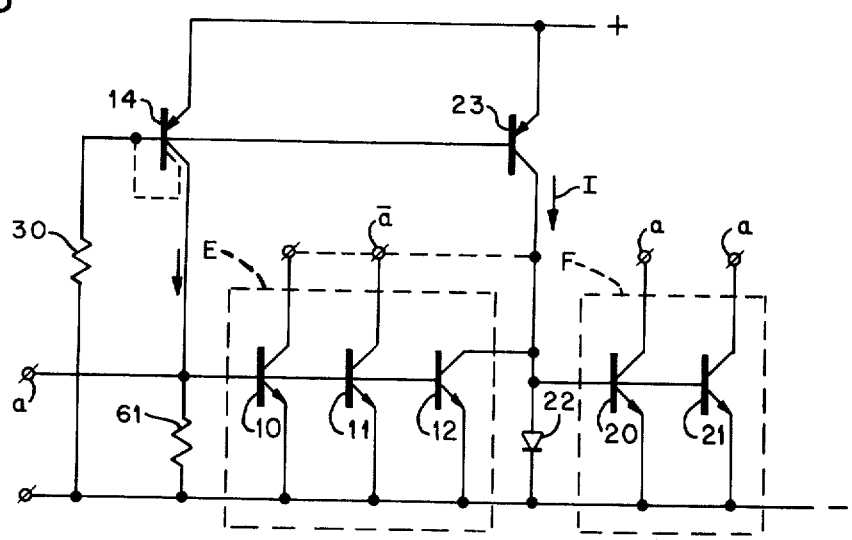

For those skilled in the art numerous modifications are possible within the scope of the invention. For example, to improve the noise margin, a resistance can be included in series with the diode 13 in FIG. 1, the input of the logic gate circuit then being constituted by the connection point of said resistance and the diode. This is illustrated in FIG. 5, with the series resistance designated 60. FIG. 6 shows another variation with a resistor 61 substituted for the diode 13.

What is claimed is:

1. A logic gate circuit, comprising a first group of transistors each having emitter, base and collector, means connecting in parallel one of the base-emitter and collector-emitter paths of the transistors in the first group, a second group of transistors each having emitter, base and collector, means connecting in parallel the base-emitter paths of the transistors in the second group to the collector-emitter path of at least one of the transistors of the first group, a current source for biasing the transistors of the first group and coupled to a common connection point of the emitters of the transistors of the first group, a current source for biasing the transistors of the second group and coupled to a common connection point of the emitters of the transistors of the second group, each of the bases of the transistors of the first and the second group being connected respectively to the current source for the transistors of the first and the second group, and means providing between the base and the emitter of each of the transistors of the first and second groups a current path for sinking a part of the current which is supplied by the current source which is connected to the base of each said transistor when each said transistor is in the conductive state.

2. A logic gate circuit as claimed in claim 1, wherein the current path for sinking part of the current source comprises a diode whose forward direction is the same as the forward direction of the base-emitter diode of each said transistor connected to the current source.

3. A logic gate circuit as claimed in claim 2, wherein the diode is constituted by a transistor whose base and collector are interconnected, the effective emitter area of said transistor being smaller than the effective emitter area of each said transistor.

4. A logic gate circuit as claimed in claim 1, wherein the current path is constituted by a resistance.

5. A logic gate circuit as claimed in claim 1, wherein the transistors of the first and the second group are of the NPN-type and the current sources each comprise a lateral PNP-transistor, and a resistor connects the base of the lateral PNP-transistor to the emitters of the transistors it biases.

6. A logic gate circuit as claimed in claim 2, wherein a resistance is included in series with the diode.

* * * * *